(12) United States Patent
Illek et al.

(10) Patent No.: US 9,978,733 B2
(45) Date of Patent: May 22, 2018

(54) OPTOELECTRONIC SEMICONDUCTOR COMPONENT AND METHOD FOR PRODUCING SAME

(71) Applicant: OSRAM Opto Semiconductors GmbH, Regensburg (DE)

(72) Inventors: Stefan Illek, Donaustauf (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days. days.

(21) Appl. No.: 14/769,779

(22) PCT Filed: Jan. 22, 2014

(86) PCT No.: PCT/EP2014/051250
§ 371 (c)(1),
(2) Date: Aug. 21, 2015

(87) PCT Pub. No.: WO2014/127953
PCT Pub. Date: Aug. 28, 2014

(65) Prior Publication Data
US 2016/0005722 A1   Jan. 7, 2016

(30) Foreign Application Priority Data

Feb. 22, 2013   (DE) .................. 10 2013 202 904

(51) Int. Cl.
*H01L 33/00* (2010.01)
*H01L 25/16* (2006.01)
(Continued)

(52) U.S. Cl.
CPC .......... *H01L 25/167* (2013.01); *H01L 33/486* (2013.01); *H01L 33/54* (2013.01);
(Continued)

(58) Field of Classification Search
CPC ........ H01L 25/167; H01L 33/54; H01L 33/62
(Continued)

(56) References Cited

U.S. PATENT DOCUMENTS 5,776,796 A * 7/1998 Distefano ............... H01L 21/56
257/E21.502
5,841,193 A * 11/1998 Eichelberger ....... H01L 23/5389
257/723
(Continued)

FOREIGN PATENT DOCUMENTS

CN        1873975 A    12/2006
CN        101030617 A   9/2007
(Continued)

Primary Examiner — Jay C Kim
(74) Attorney, Agent, or Firm — Slater Matsil, LLP (57) ABSTRACT

An optoelectronic semiconductor component includes an optoelectronic semiconductor chip with a first surface and a second surface. The component also includes a protective chip which has a protective diode, a first surface and a second surface. The semiconductor chip and the protective chip are embedded in a molded body. A first electrical contact and a second electrical contact are arranged on the first surface of the semiconductor chip. A third electrical contact and a fourth electrical contact are arranged on the first surface of the protective chip. The first electrical contact is electrically connected to the third electrical contact. In addition, the second electrical contact is electrically connected to the fourth electrical contact.

14 Claims, 3 Drawing Sheets (51) Int. Cl.
*H01L 33/48* (2010.01)
*H01L 33/54* (2010.01)
*H01L 33/62* (2010.01)
*H01L 33/64* (2010.01)

(52) U.S. Cl.
CPC .............. *H01L 33/62* (2013.01); *H01L 33/64* (2013.01); *H01L 2224/48091* (2013.01); *H01L 2224/48137* (2013.01); *H01L 2224/49175* (2013.01); *H01L 2933/005* (2013.01); *H01L 2933/0066* (2013.01)

(58) Field of Classification Search
USPC .......................................................... 257/99
See application file for complete search history.

(56) References Cited

U.S. PATENT DOCUMENTS

| | | | | |
|---|---|---|---|---|
| 6,054,716 | A * | 4/2000 | Sonobe | H01L 25/167 250/552 |
| 6,198,171 | B1 * | 3/2001 | Huang | H01L 23/3107 257/787 |
| 6,300,138 | B1 | 10/2001 | Gleason et al. | |
| 6,602,740 | B1 * | 8/2003 | Mitchell | H01L 21/56 257/E21.502 |
| 6,620,648 | B2 * | 9/2003 | Yang | H01L 23/3121 257/E23.035 |
| 6,696,704 | B1 * | 2/2004 | Maeda | H01L 25/167 257/100 |
| 6,727,576 | B2 * | 4/2004 | Hedler | H01L 21/561 257/675 |
| 6,791,116 | B2 * | 9/2004 | Takahashi | H01L 33/508 257/100 |
| 6,861,677 | B2 * | 3/2005 | Chen | H01L 25/167 257/99 |
| 6,927,095 | B2 * | 8/2005 | Smith | H01L 23/3121 257/E23.069 |
| 6,936,855 | B1 * | 8/2005 | Harrah | F21K 9/00 257/59 |
| 7,064,353 | B2 * | 6/2006 | Bhat | H01L 27/15 257/79 |
| 7,081,667 | B2 * | 7/2006 | Du | H01L 23/50 257/668 |
| 7,238,602 | B2 * | 7/2007 | Yang | H01L 23/49816 257/E23.069 |
| 7,326,964 | B2 * | 2/2008 | Lim | H01L 33/62 257/79 |
| 7,405,431 | B2 * | 7/2008 | Aoyagi | H01L 25/167 257/103 |
| 7,425,727 | B2 * | 9/2008 | Shoji | H01L 21/565 257/100 |
| 7,582,537 | B2 * | 9/2009 | Song | H01L 29/866 438/380 |
| 7,655,997 | B2 * | 2/2010 | Wang | H01L 23/544 257/431 |
| 7,714,341 | B2 * | 5/2010 | Chil Keun | H01L 25/167 257/100 |
| 7,738,764 | B2 | 6/2010 | Kim | |
| 7,804,099 | B2 * | 9/2010 | Beeson | H01L 33/42 257/89 |
| 7,808,013 | B2 * | 10/2010 | Mendendorp, Jr. | H01L 33/64 257/675 |
| 7,928,462 | B2 * | 4/2011 | Jang | H01L 25/167 257/106 |
| 8,044,415 | B2 * | 10/2011 | Messere | B32B 17/10 257/88 |
| 8,058,669 | B2 * | 11/2011 | Chen | H01L 25/0753 257/59 |
| 8,093,722 | B2 * | 1/2012 | Chen | H01L 21/563 257/737 |
| 8,198,109 | B2 * | 6/2012 | Lerman | H01L 25/0753 438/28 |
| 8,310,051 | B2 * | 11/2012 | Chen | H01L 21/563 257/738 |
| 8,324,082 | B1 * | 12/2012 | Liu | H01L 25/167 257/678 |
| 8,338,845 | B2 * | 12/2012 | Watari | H01L 33/48 257/59 |
| 8,455,915 | B2 * | 6/2013 | Hayashi | H01L 33/62 257/100 |
| 8,460,952 | B2 * | 6/2013 | Park | H01L 33/508 257/98 |
| 8,476,657 | B2 * | 7/2013 | Kawasaki | H01L 25/167 257/100 |
| 8,648,359 | B2 * | 2/2014 | Hussell | H01L 25/0753 257/88 |
| 8,648,373 | B2 * | 2/2014 | Toyama | H01L 33/486 257/98 |
| 8,664,635 | B2 * | 3/2014 | Jung | H01L 33/505 257/13 |
| 8,704,433 | B2 * | 4/2014 | Jung | H01L 33/641 313/46 |
| 8,710,513 | B2 * | 4/2014 | Yoo | H01L 25/167 257/81 |
| 8,723,192 | B2 | 5/2014 | Weidner et al. | |
| 8,748,910 | B2 * | 6/2014 | Zhang | H05B 33/0806 257/79 |
| 8,796,706 | B2 * | 8/2014 | Jung | H01L 25/0753 257/97 |
| 8,796,710 | B2 * | 8/2014 | Kim | H01L 33/647 257/98 |
| 9,000,470 | B2 * | 4/2015 | Tudorica | H01L 33/56 257/87 |
| 9,022,828 | B2 * | 5/2015 | Imai | H01L 24/97 313/512 |
| 9,024,343 | B2 * | 5/2015 | Yamada | H01L 33/60 257/79 |
| 9,035,326 | B2 * | 5/2015 | Cho | F21S 48/115 257/82 |
| 9,076,714 | B2 * | 7/2015 | Nakatani | H01L 25/167 257/536 |
| 9,099,616 | B2 * | 8/2015 | Andrews | H01L 24/85 |
| 9,136,447 | B2 * | 9/2015 | Yoneda | H01L 33/58 |
| 9,142,592 | B2 * | 9/2015 | Mayerhofer | H01L 23/60 |
| 9,159,892 | B2 * | 10/2015 | Fukushima | H01L 33/46 |
| 9,196,805 | B2 * | 11/2015 | Yamada | H01L 24/48 |
| 9,219,208 | B2 * | 12/2015 | Yoon | H01L 33/62 |
| 9,236,547 | B2 * | 1/2016 | Palaniswamy | H01L 33/62 |
| 9,391,118 | B2 * | 7/2016 | Negley | H01L 21/2654 |
| 9,406,639 | B2 * | 8/2016 | Kim | H01L 23/3135 |
| 9,418,973 | B2 * | 8/2016 | Min | H01L 25/167 |
| 2001/0015443 | A1 * | 8/2001 | Komoto | H01L 33/62 257/81 |
| 2004/0089872 | A1 | 5/2004 | Whitworth et al. | |
| 2005/0156186 | A1 * | 7/2005 | Lin | H01L 25/0753 257/99 |
| 2006/0267040 | A1 * | 11/2006 | Baek | H01L 25/167 257/99 |
| 2008/0035942 | A1 * | 2/2008 | Kim | H01L 33/486 257/98 |
| 2008/0211416 | A1 * | 9/2008 | Negley | H01L 27/15 315/193 |
| 2009/0078960 | A1 * | 3/2009 | Wang | H01L 25/167 257/100 |
| 2009/0218588 | A1 | 9/2009 | Panaccione et al. | |
| 2009/0266596 | A1 | 10/2009 | Chang | |
| 2009/0316315 | A1 | 12/2009 | Wang et al. | |
| 2010/0213588 | A1 * | 8/2010 | Hsieh | H01L 23/49816 257/676 |
| 2010/0213589 | A1 * | 8/2010 | Hsieh | H01L 21/4832 257/676 |
| 2011/0012151 | A1 | 1/2011 | Ono | |
| 2012/0146077 | A1 * | 6/2012 | Nakatsu | H01L 33/486 257/98 |
| 2013/0001633 | A1 * | 1/2013 | Imai | H01L 33/60 257/99 |

(56) References Cited

U.S. PATENT DOCUMENTS

| | | | | |
|---|---|---|---|---|
| 2014/0001949 A1* | 1/2014 | Kimura | ............... | H05B 33/10 |
| | | | | 313/498 |
| 2014/0151734 A1* | 6/2014 | Ito | ............... | H01L 33/58 |
| | | | | 257/98 |
| 2014/0301054 A1* | 10/2014 | Nagai | ............... | H01L 33/62 |
| | | | | 361/761 |

FOREIGN PATENT DOCUMENTS

| | | | | | |
|---|---|---|---|---|---|
| CN | 102754229 A | 10/2012 | | | |
| DE | 102009036621 A1 | 2/2011 | | | |
| EP | 1826834 A2 | 8/2007 | | | |
| JP | 200012913 A | 1/2000 | | | |
| KR | 1020120014298 A | 2/2012 | | | |
| TW | 200945981 A | 11/2009 | | | |
| TW | 201008379 A | 2/2010 | | | |
| WO | WO 2011/099384 | * | 8/2011 | ............ | H01L 33/48 |
| WO | WO 2012/002580 | * | 1/2012 | ............ | H01L 33/60 |

* cited by examiner

FIG 6

OPTOELECTRONIC SEMICONDUCTOR COMPONENT AND METHOD FOR PRODUCING SAME

This patent application is a national phase filing under section 371 of PCT/EP2014/051250, filed Jan. 22, 2014, which claims the priority of German patent application 10 2013 202 904.7, filed Feb. 22, 2013, each of which is incorporated herein by reference in its entirety.

TECHNICAL FIELD

The present invention relates to an optoelectronic semiconductor component, and to a method for producing an optoelectronic semiconductor component.

BACKGROUND

In the prior art, optoelectronic semiconductor components have housings that fulfil a plurality of functions. These include the provision of electrical connections for optoelectronic semiconductor chips of the optoelectronic semiconductor components, the provision of suitable mounting interfaces, for example, for surface mounting according to an SMT method, and the mechanical connection of the individual component parts of the semiconductor components. Besides the optoelectronic semiconductor chip, a protective chip having an ESD protective diode is often integrated as well, which protective chip protects the optoelectronic semiconductor component against damage as a result of an electrostatic discharge. Owing to the multiplicity of functions to be fulfilled, the housings of conventional optoelectronic semiconductor components constitute a significant cost factor.

German patent document DE 10 2009 036 621 A1 discloses a method for producing an optoelectronic semiconductor component in which optoelectronic semiconductor chips are arranged at a top side of a carrier. The optoelectronic semiconductor chips are encapsulated with a molded body that covers all side surfaces of the optoelectronic semiconductor chips. Top sides and under sides of the optoelectronic semiconductor chips preferably remain free. After the carrier has been removed, the optoelectronic semiconductor chips can be singulated. Contact locations can be provided at the top side and/or under side of each semiconductor chip. The molded body can consist of an epoxy-based molding material, for example.

SUMMARY

Embodiments of the present invention provide an optoelectronic semiconductor component. Further embodiments of the invention specify a method for producing an optoelectronic semiconductor component.

An optoelectronic semiconductor component comprises an optoelectronic semiconductor chip having a first surface and a second surface, and also a protective chip having a protective diode and having a first surface and a second surface. In this case, the semiconductor chip and the protective chip are embedded into a molded body. A first electrical contact and a second electrical contact are arranged at the first surface of the semiconductor chip. A third electrical contact and a fourth electrical contact are arranged at the first surface of the protective chip. In this case, the first electrical contact is electrically conductively connected to the third electrical contact. Moreover, the second electrical contact is electrically conductively connected to the fourth electrical contact.

Advantageously, the protective chip having the protective diode that is integrated into this optoelectronic semiconductor component protects the optoelectronic semiconductor chip against damage as a result of electrostatic discharges. Advantageously, the optoelectronic semiconductor component is hereby already protected before and during mounting. A further advantage of the optoelectronic semiconductor component is that it does not require a separate through contact extending through the molded body, as a result of which the optoelectronic semiconductor component can be produced cost-effectively and with compact dimensions. A further advantage of the optoelectronic semiconductor component is that it does not require any wiring arranged on an under side of the optoelectronic semiconductor component, which likewise supports cost-effective produceability of the optoelectronic semiconductor component.

In one embodiment of the optoelectronic semiconductor component, a first electrical contact area and a second electrical contact area are arranged at an under side of the semiconductor component. In this case, the semiconductor chip and the protective chip are electrically connected antiparallel between the first electrical contact area and the second electrical contact area. Advantageously, the semiconductor chip is protected against damage as a result of electrostatic discharges by the antiparallel connection of semiconductor chip and protective chip.

In one embodiment of the optoelectronic semiconductor component, the latter is embodied as a surface-mountable component. Advantageously, the optoelectronic semiconductor component is thereby suitable for surface mounting according to an SMT method, for example, for mounting by means of reflow soldering. Advantageously, the optoelectronic semiconductor component can thereby be embodied in a particularly space-saving fashion.

In one embodiment of the optoelectronic semiconductor component, the second electrical contact area is arranged at the second surface of the protective chip. Advantageously, the second electrical contact area can already be arranged at the second surface of the protective chip before the protective chip is embedded into the molded body, as a result of which the optoelectronic semiconductor component is producible cost-effectively.

In one embodiment of the optoelectronic semiconductor component, the protective chip has an electrically conductive connection between the second electrical contact area and the fourth electrical contact. Advantageously, the electrically conductive connection integrated into the protective chip makes it possible to dispense with providing a separate electrical feedthrough through the molded body of the optoelectronic semiconductor component without a corresponding further wiring.

In one embodiment of the optoelectronic semiconductor component, the first electrical contact area is arranged at the second surface of the protective chip. Advantageously, the first electrical contact area, too, can already be arranged at the second surface of the protective chip before the protective chip is embedded into the molded body, as a result of which the optoelectronic semiconductor component is producible cost-effectively.

In one embodiment of the optoelectronic semiconductor component, the protective chip has an electrically conductive connection between the first electrical contact area and the third electrical contact. Advantageously, this electrically conductive connection—integrated into the protective chip—between the third electrical contact and the first electrical contact area also makes it possible to dispense with a separate electrical feedthrough through the molded body and to dispense with further wirings required therefor.

In one embodiment of the optoelectronic semiconductor component, a thermally conductive contact area is arranged at the second surface of the semiconductor chip. Advantageously, the thermally conductive contact area can serve for dissipating waste heat generated in the semiconductor chip. In this case, the thermally conductive contact area can advantageously be contacted simultaneously with electrically conductive contact areas of the optoelectronic semiconductor component in a method for surface mounting.

In one embodiment of the optoelectronic semiconductor component, the first electrical contact area is arranged at the second surface of the semiconductor chip. Advantageously, the first electrical contact area can already be arranged at the second surface of the semiconductor chip before the semiconductor chip is embedded into the molded body, as a result of which the optoelectronic semiconductor component is producible cost-effectively.

In one embodiment of the optoelectronic semiconductor component, the semiconductor chip has an electrically conductive connection between the first electrical contact area and the first electrical contact. Advantageously, this electrically conductive connection between the first electrical contact area and the first electrical contact also makes it possible to dispense with a separate electrical feedthrough through the molded body of the optoelectronic semiconductor component and to dispense with additional wirings.

In one embodiment of the optoelectronic semiconductor component, the electrically conductive connection between the first electrical contact and the third electrical contact and/or the electrically conductive connection between the second electrical contact and the fourth electrical contact is embodied as a bond connection or as a planar connection. Advantageously, an embodiment of the electrically conductive connections as bond connection enables the optoelectronic semiconductor component to be produced cost-effectively. An embodiment of the electrically conductive connections as planar connections leads to a very robust optoelectronic semiconductor component.

In one embodiment of the optoelectronic semiconductor component, the first surface of the semiconductor chip is a radiation emission face of the semiconductor chip. Advantageously, electromagnetic radiation generated in the semiconductor chip can then emerge through the first surface of the semiconductor chip.

In one embodiment of the optoelectronic semiconductor component, the optoelectronic semiconductor chip is an LED chip. The optoelectronic semiconductor component then forms a very compact light emitting diode with integrated protective chip having an ESD protective diode.

A method for producing an optoelectronic semiconductor component comprises steps for providing an optoelectronic semiconductor chip having a first surface, wherein a first electrical contact and a second electrical contact are arranged at the first surface of the semiconductor chip, for providing a protective chip having a protective diode and having a first surface, wherein a third electrical contact and a fourth electrical contact are arranged at the first surface of the protective chip, for forming a molded body, wherein the semiconductor chip and the protective chip are embedded into the molded body, and for producing electrically conductive connections between the first electrical contact and the third electrical contact and also between the second electrical contact and the fourth electrical contact. Advantageously, the method enables cost-effective production of an optoelectronic semiconductor component with compact dimensions. This is achieved in particular by dispensing with electrical through contacts integrated into the molded body and by dispensing with a wiring at a rear side of the optoelectronic semiconductor chip.

In one embodiment of the method, the first surface of the semiconductor chip and the first surface of the protective chip are arranged on a carrier before the molded body is formed. Advantageously, this ensures that the first surfaces of semiconductor chip and protective chip are not covered by the molded body after the molded body has been formed. In this case, the molded body can be formed in a molding process, for example.

BRIEF DESCRIPTION OF THE DRAWINGS

The above-described properties, features and advantages of the invention and also the way in which they are achieved will become clearer and more clearly understood in association with the following description of the exemplary embodiments which are explained in greater detail in association with the drawings. Here in each case in schematic illustration.

DETAILED DESCRIPTION OF ILLUSTRATIVE EMBODIMENTS

Figure 1:
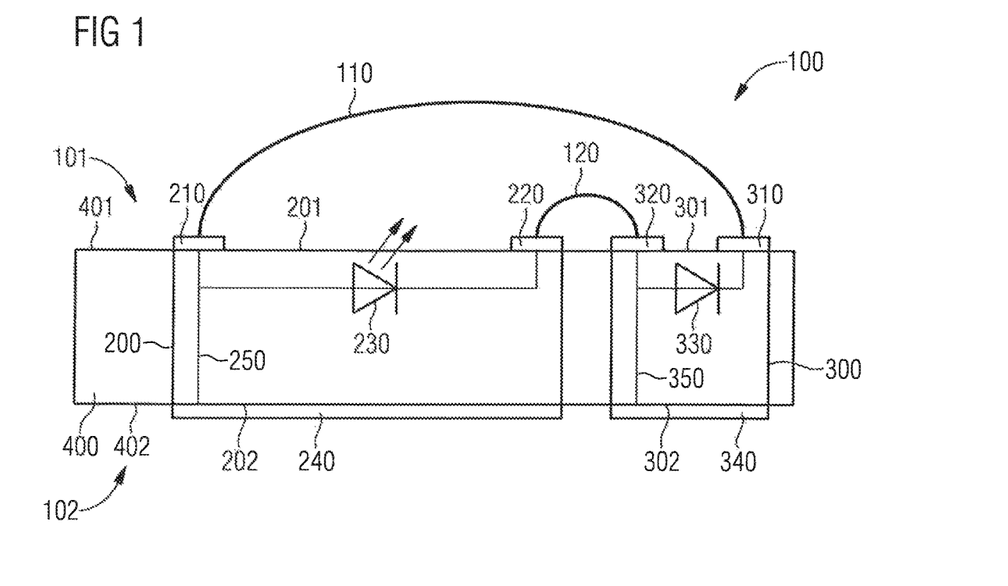
FIG. 1 shows a section through an optoelectronic semiconductor component in accordance with a first embodiment.

FIG. 1 shows a schematic sectional illustration of an optoelectronic semiconductor component 100 in accordance with a first embodiment. The optoelectronic semiconductor component 100 can be a light emitting diode, for example.

The optoelectronic semiconductor component 100 has a top side 101 and an under side 102 situated opposite the top side 101. The optoelectronic semiconductor component 100 comprises a molded body 400 having a top side 401 and an underside 402 situated opposite the top side 401.

An optoelectronic semiconductor chip 200 and a protective chip 300 are embedded into the molded body 400. The optoelectronic semiconductor chip 200 has a first surface 201 and a second surface 202 situated opposite the first surface 201. The protective chip 300 has a first surface 301 and a second surface 302 situated opposite the first surface 301.

The first surface 201 of the optoelectronic semiconductor chip 200 and the first surface 301 of the protective chip 300 terminate approximately flush with the top side 401 of the molded body 400. The first surface 201 of the optoelectronic semiconductor chip 200, the first surface 301 of the protective chip 300 and the top side 401 of the molded body 400 jointly form the top side 101 of the optoelectronic semiconductor component 100. The second surface 202 of the optoelectronic semiconductor chip 200 and the second surface 302 of the protective chip 300 terminate approximately flush with the underside 402 of the molded body 400. The second surface 202 of the optoelectronic semiconductor chip 200, the second surface 302 of the protective chip 300 and the underside 402 of the molded body 400 jointly form the underside 102 of the optoelectronic semiconductor component 100.

Figure 2:
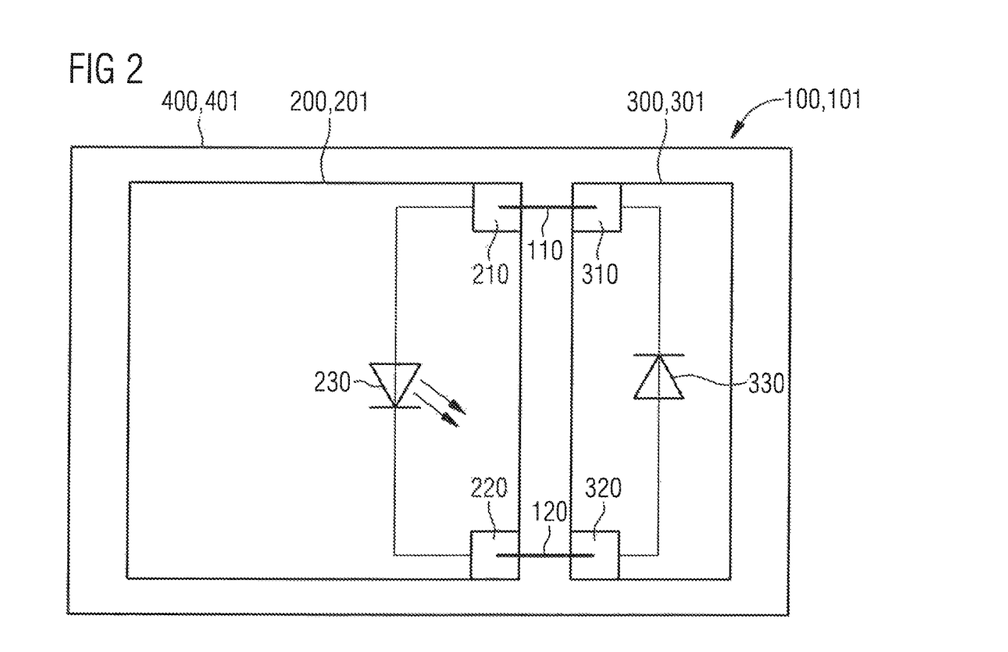
FIG. 2 shows a plan view of the optoelectronic semiconductor component of the first embodiment.
Figure 3:
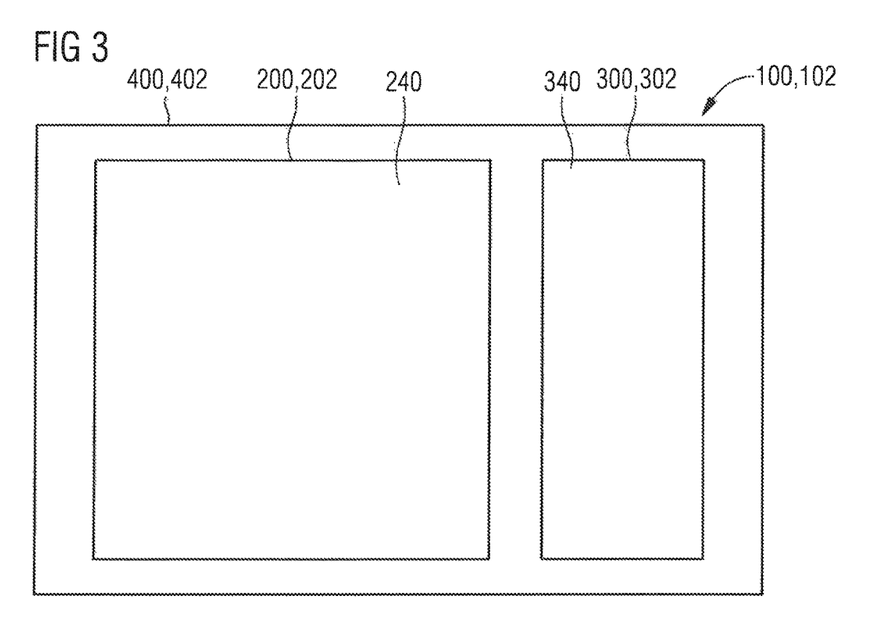
FIG. 3 shows a view of the optoelectronic semiconductor component of the first embodiment from below.

FIG. 2 shows a schematic plan view of the top side 101 of the optoelectronic semiconductor chip 100. The top side 401 of the molded body 400, the first surface 201 of the optoelectronic semiconductor chip 200 and the first surface 301 of the protective chip 300 are visible. FIG. 3 shows a schematic illustration of the underside 102 of the optoelectronic semiconductor component 100. The underside 402 of the molded body 400, the second surface 202 of the optoelectronic semiconductor chip 200 and the second surface 302 of the protective chip 300 are discernible.

The molded body 400 comprises an electrically insulating material, for example, an epoxide. The molded body 400 can be produced by injection molding or transfer molding or some other molding process, for example. In particular, the molded body 400 can be produced by film-assisted transfer molding. The surfaces 201, 202 of the optoelectronic semiconductor chip 200 embedded into the molded body 400 and the surfaces 301, 302 of the protective chip 300 embedded into the molded body 400 are not covered or are scarcely covered by the material of the molded body 400. The remaining outer surfaces of the optoelectronic semiconductor chip 200 and of the protective chip 300 are preferably completely or almost completely covered by the molded body 400. The molded body 400 thus forms a mechanically robust and cost-effectively producible housing for the optoelectronic semiconductor chip 200 and the protective chip 300.

A diode circuit 230 integrated into the optoelectronic semiconductor chip 200 is indicated schematically in FIG. 1. The optoelectronic semiconductor chip 200 can be an LED chip, for example. In this case, the diode circuit 230 is a light emitting diode circuit. The first surface 201 of the optoelectronic semiconductor chip 200 preferably forms a radiation emission face of the optoelectronic semiconductor chip 200. Electromagnetic radiation generated in the optoelectronic semiconductor chip 200 can then emerge from the optoelectronic semiconductor chip 200 through the first surface 201.

A first electrical contact 210 and a second electrical contact 220 are arranged on the first surface 201 of the optoelectronic semiconductor chip 200. If the optoelectronic semiconductor chip 200 is an LED chip, then the first electrical contact 210 can be connected to the anode of the integrated diode circuit 230, while the second electrical contact 220 is connected to the cathode of the integrated diode circuit 230.

FIG. 2 shows that the first electrical contact 210 and the second electrical contact 220 are preferably arranged in corner regions of the first surface 201 of the optoelectronic semiconductor chip 200 and occupy only a small part of the area of the first surface 201. If the first surface 201 of the optoelectronic semiconductor chip 200 forms a radiation emission face, then radiation emerging through the first surface 201 is thereby advantageously shaded by the first electrical contact 210 and the second electrical contact 220 only to a small extent.

A first electrical contact area 240 is arranged at the second surface 202 of the optoelectronic semiconductor chip 200. The first electrical contact area 240 can be embodied as metallization, for example.

The first electrical contact area 240 is electrically conductively connected to the first electrical contact 201 and thus also to the diode circuit 230 via a first feedthrough connection 250. The first feedthrough connection 250 extends through the optoelectronic semiconductor chip 200. Preferably, the first feedthrough connection 250 was already created during the production of the optoelectronic semiconductor chip 200. The first feedthrough connection 250 can also be formed by an electrically conductive carrier of the semiconductor chip 200.

The protective chip 300 has an integrated protective diode 330. The protective diode 330 is indicated schematically in FIGS. 1 and 2. The protective diode 330 can also be designated as an ESD diode. The protective chip 300 serves to protect the optoelectronic semiconductor chip 200 of the optoelectronic semiconductor component 100 against damage as a result of an electrostatic discharge. For this purpose, the protective chip 300 is connected in parallel with the optoelectronic semiconductor chip 200 in such a way that the protective diode 330 and the diode circuit 230 are arranged electrically antiparallel.

A third electrical contact 310 and a fourth electrical contact 320 are formed at the first surface 301 of the protective chip 300. The third electrical contact 310 is connected to the cathode of the protective diode 330. The fourth electrical contact 320 is electrically conductively connected to the anode of the protective diode 330. As can be gathered from the schematic plan view in FIG. 2, the third electrical contact 310 and the fourth electrical contact 320 can be arranged in corner regions of the first surface 310 of the protective chip 300. The third electrical contact 310 is preferably arranged as near as possible to the first electrical contact 210 at the first surface 201 of the optoelectronic semiconductor chip 200. The fourth electrical contact 320 is preferably arranged as near as possible to the second electrical contact 220 at the first surface 201 of the optoelectronic semiconductor chip 200.

A second electrical contact area 340 is arranged at the second surface 302 of the protective chip 300. The second electrical contact area 340 can be embodied as metallization, for example. The second electrical contact area 340 is electrically conductively connected to the fourth electrical contact 320 and thus also to the anode of the protective diode 330 via a second feedthrough connection 350. The second feedthrough connection 350 extends through the protective chip 300 and was preferably already created during the production of the protective chip 300.

Between the first electrical contact 210 at the first surface 201 of the optoelectronic semiconductor chip 200 and the third electrical contact 310 at the first surface 301 of the protective chip 300, there is a first electrically conductive connection 110 arranged above the top side 101 of the optoelectronic semiconductor component 100. Between the second electrical contact 220 of the optoelectronic semiconductor chip 200 and the fourth electrical contact 320 of the protective chip 300, there is a second electrically conductive connection 120 arranged above the top side 101 of the optoelectronic semiconductor component 100. The first electrically conductive connection 110 and the second electrically conductive connection 120, as illustrated schematically in FIGS. 1 and 2, can be embodied as bond connections imparted by bonding wires. However, the first electrically conductive connection 110 and the second electrically conductive connection 120 could also be embodied as planar connections, for example. The first electrically conductive connection 110 and the second electrically conductive connection 120 are created after the optoelectronic semiconductor chip 200 and the protective chip 300 have been embedded into the molded body 400.

By means of the first electrically conductive connection 110 and the second electrically conductive connection 120, the diode circuit 230 of the optoelectronic semiconductor chip 200 and the protective diode 330 of the protective chip 300 are connected in parallel with mutually opposite polarities. The parallel connection is accessible externally between the first electrical contact area 240 and the second electrical contact area 340 of the optoelectronic semiconductor component 100.

Figure 4:
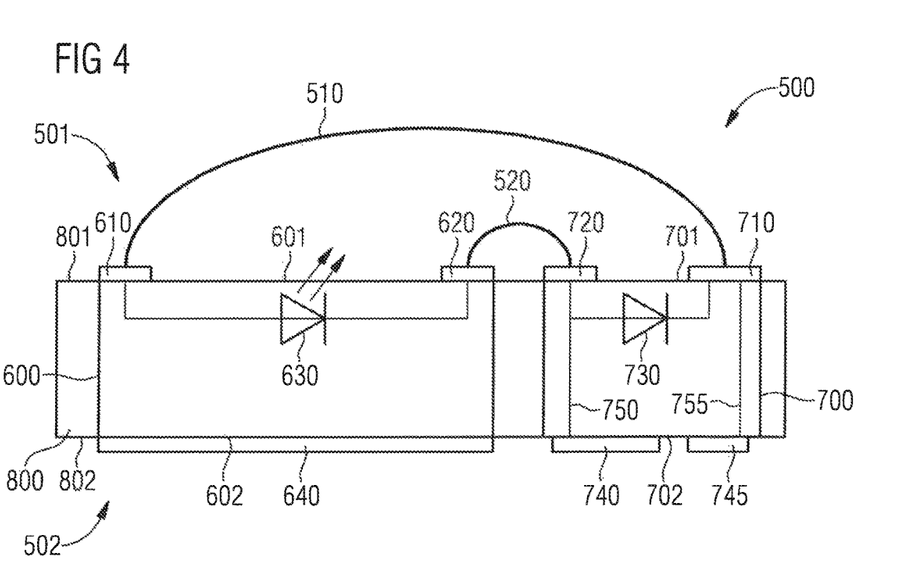
FIG. 4 shows a section through an optoelectronic semiconductor component in accordance with a second embodiment.

FIG. 4 shows a schematic sectional illustration of an optoelectronic semiconductor component 500 in accordance with a second embodiment. The optoelectronic semiconductor component 500 can be a light emitting diode, for example.

The optoelectronic semiconductor component 500 has a top side 501 and an underside 502 situated opposite the top side 501. The optoelectronic semiconductor component 500 comprises an optoelectronic semiconductor chip 600 having a first surface 601 and a second surface 602 situated opposite the first surface 601. Furthermore, the optoelectronic semiconductor component 500 comprises a protective chip 700 having a first surface 701 and a second surface 702 situated opposite the first surface 701. The optoelectronic semiconductor chip 600 and the protective chip 700 are embedded into a molded body 800 having a top side 801 and an underside 802 situated opposite the top side 801.

The first surface 601 of the optoelectronic semiconductor chip 600 and the first surface 701 of the protective chip 700 are substantially not covered by the molded body 800 and terminate substantially flush with the top side 801 of the molded body 800. The top side 801 of the molded body 800, the first surface 601 of the optoelectronic semiconductor chip 600 and the first surface 701 of the protective chip 700 jointly form the top side 501 of the optoelectronic semiconductor component 500. The second surface 602 of the optoelectronic semiconductor chip 600 and the second surface 702 of the protective chip 700 are substantially not covered by the molded body 800 and terminate substantially flush with the underside 802 of the molded body 800. The second surface 602 of the optoelectronic semiconductor chip 600, the second surface 702 of the protective chip 700 and the underside 802 of the molded body 800 jointly form the underside 502 of the optoelectronic semiconductor component 500.

Figure 5:
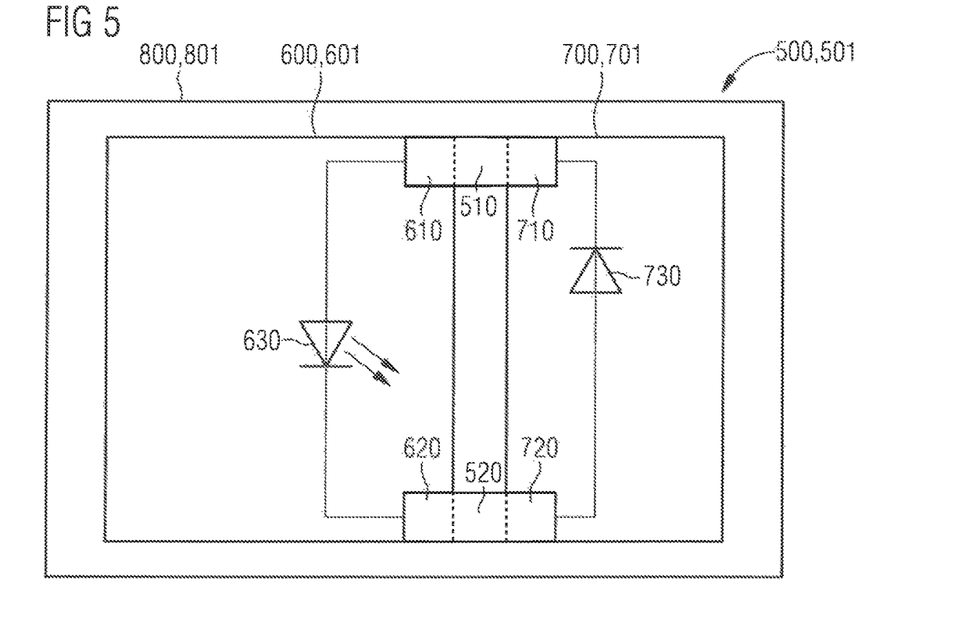
FIG. 5 shows a plan view of the optoelectronic semiconductor component of the second embodiment.
Figure 6:
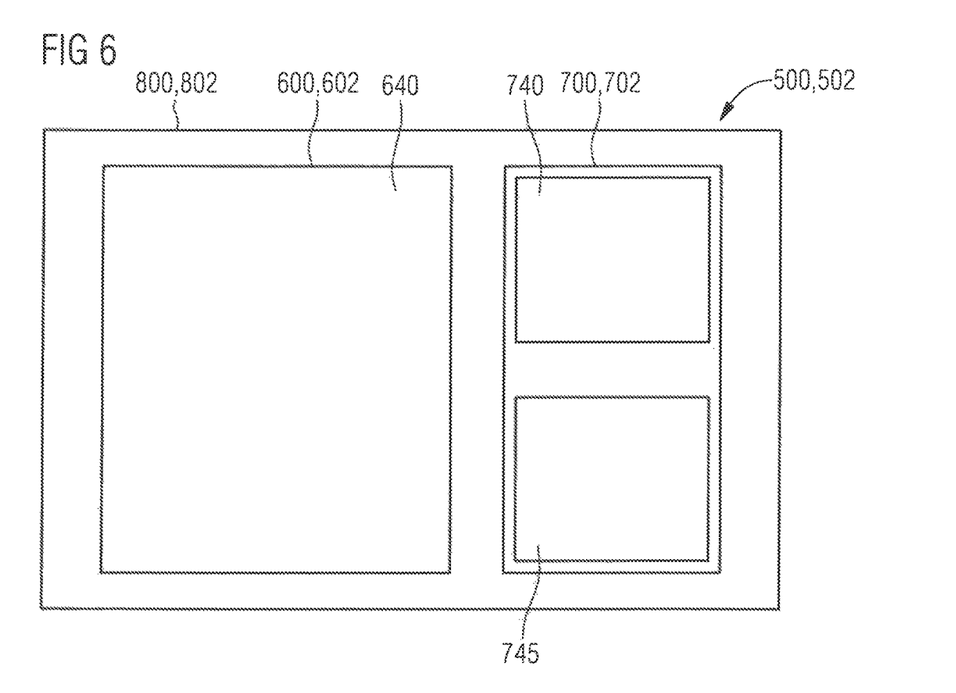
FIG. 6 shows a view of the optoelectronic semiconductor component of the second embodiment from below.

FIG. 5 shows a view of the top side 501 of the optoelectronic semiconductor component 500 in schematic illustration. The top side 801 of the molded body 800, the first surface 601 of the optoelectronic semiconductor chip 600 and the first surface 701 of the protective chip 700 are discernible. FIG. 6 shows a schematic view of the underside 502 of the optoelectronic semiconductor component 500. The under side 802 of the molded body 800, the second surface 602 of the optoelectronic semiconductor chip 600 and the second surface 702 of the protective chip 700 are visible.

The molded body 800 once again comprises an electrically insulating material, for example, an epoxide. The molded body 800 is preferably produced by a molding process. In this respect, the optoelectronic semiconductor component 500 corresponds to the optoelectronic semiconductor component 100 in FIGS. 1 to 3.

The optoelectronic semiconductor chip 600 has an integrated diode circuit 630. The optoelectronic semiconductor chip 600 can be an LED chip, for example. In this case, the diode circuit 630 is a light emitting diode circuit. The first surface 601 can then form a radiation emission face of the optoelectronic semiconductor chip 600, through which electromagnetic radiation generated in the optoelectronic semiconductor chip 600 can emerge from the optoelectronic semiconductor chip 600.

A first electrical contact 610 and a second electrical contact 620 are arranged at the first surface 601 of the optoelectronic semiconductor chip 600. Preferably, the electrical contacts 610 and 620 are arranged in edge or corner regions of the first surface 601, as is illustrated in FIG. 5. As a result, emergence of radiation through the first surface 601 of the optoelectronic semiconductor chip 600 is impeded by the electrical contacts 610, 620 only to a small extent.

The first electrical contact 610 is electrically connected to an anode of the diode circuit 630. The second electrical contact 620 is electrically conductively connected to a cathode of the diode circuit 630.

A thermal contact area 640 is arranged at the second surface 602 of the optoelectronic semiconductor chip 600. The thermal contact area 640 can be embodied as a metallization, for example. The thermal contact area 640 can serve to conduct waste heat generated in the optoelectronic semiconductor chip 600 out of the optoelectronic semiconductor chip 600 and to lead it away from the optoelectronic semiconductor chip 600.

The protective chip 700 has an integrated protective diode 730, which can also be designated as an ESD diode. A third electrical contact 710 and a fourth electrical contact 720 are arranged at the first surface 701 of the protective chip 700. The third electrical contact 710 is electrically conductively connected to a cathode of the protective diode 730. The fourth electrical contact 720 is electrically conductively connected to an anode of the protective diode 730.

A first electrical contact area 745 and a second electrical contact area 740 are arranged at the second surface 702 of the protective chip 700. The first electrical contact area 745 and the second electrical contact area 740 can be embodied, for example, as metallizations arranged at the second surface 702. The first electrical contact area 745 is electrically conductively connected to the third electrical contact 710 and thus also to the cathode of the protective diode 730 via a first feedthrough connection 755. The second electrical contact area 740 is electrically conductively connected to the fourth electrical contact 720 of the protective chip 700 and thus also to the anode of the protective diode 730 via a second feedthrough connection 750. The feedthrough connections 750, 755 extend through the protective chip 700 and were preferably already created during the production of the protective chip 700.

The first electrical contact 610 of the optoelectronic semiconductor chip 600 is connected to the third electrical contact 710 of the protective chip 700 via a first electrically conductive connection 510. The second electrical contact 620 of the optoelectronic semiconductor chip 600 is connected to the fourth electrical contact 720 of the protective chip 700 via a second electrically conductive connection 520. The first electrically conductive connection 510 and the second electrically conductive connection 520 are both arranged above the top side 501 of the optoelectronic semiconductor component 500. In the example illustrated, the electrically conductive connections 510, 520 are embodied as bond connections. However, the electrically conductive connections 510, 520 could, for example, also be embodied as planar connections at the top side 501 of the optoelectronic semiconductor component 500. The electrically conductive connections 510, 520 are created after the optoelectronic semiconductor chip 600 and the protective chip 700 have been embedded into the molded body 800.

A parallel connection of the diode circuit 630 of the optoelectronic semiconductor chip 600 and of the protective diode 730 of the protective chip 700 is arranged between the first electrical contact area 745 and the second electrical contact area 740 of the optoelectronic semiconductor component 500. In this case, the diode circuit 630 and the protective diode 730 are oriented antiparallel with respect to one another. The protective diode 730 of the protective chip 700 serves to protect the optoelectronic semiconductor chip 600 against damage as a result of an electrostatic discharge.

The optoelectronic semiconductor component 100 in FIGS. 1 to 3 and the optoelectronic semiconductor component 500 in FIGS. 4 to 6 are in each case suitable for surface mounting according to an SMT method. By way of example, the first electrical contact area 240 and the second electrical contact area 340 of the optoelectronic semiconductor component 100, and the first electrical contact area 745 and the second electrical contact area 740 of the optoelectronic semiconductor component 500 can be electrically contacted by means of reflow soldering. In the case of the optoelectronic semiconductor component 500, the thermal contact area 640 is in this case preferably simultaneously also coupled to a heat sink via a soldering connection in order to dissipate waste heat from the optoelectronic semiconductor chip 600 of the optoelectronic semiconductor component 500. In the case of the optoelectronic semiconductor component 100, waste heat generated in the optoelectronic semiconductor chip 200 can be dissipated via the first electrical contact area 240 at the second surface 202 of the optoelectronic semiconductor chip 200.

For producing the optoelectronic semiconductor component 100 of the first embodiment and the optoelectronic semiconductor component 500 of the second embodiment, firstly the optoelectronic semiconductor chips 200, 600 and the protective chips 300, 700 are provided. The optoelectronic semiconductor chip 200 is preferably already provided with the first electrical contact area 240 arranged at the second surface 202. The optoelectronic semiconductor chip 600 is preferably correspondingly already provided with the thermal contact area 640 arranged at the second surface 602. The protective chip 300 of the first embodiment is preferably already provided with the second electrical contact area 340 arranged at the second surface 302. The protective chip 700 of the second embodiment is preferably already provided with the first electrical contact area 745 arranged at the second surface 702 and the second electrical contact area 740 arranged at the second surface 702.

The optoelectronic semiconductor chips 200, 600 and the protective chips 300, 700 are subsequently arranged on a carrier. In this case, the first surface 201 of the optoelectronic semiconductor chip 200, and the first surface 601 of the optoelectronic semiconductor chip 600, and the first surface 301 of the protective chip 300, and the first surface 701 of the protective chip 700, face the carrier. As a result, the first surface 201, 601 of the optoelectronic semiconductor chip 200, 600 and the first surface 301, 701 of the protective chip 300, 700 are protected.

Preferably, the second surface 202, 602 of the optoelectronic semiconductor chip 200, 600 and the second surface 302, 702 of the protective chip 300, 700 are also covered and protected as a result. This can be carried out, for example, in an installation for film-assisted transfer molding. The covering of the second surface 202, 602 of the optoelectronic semiconductor chip 200, 600 and of the second surface 302, 702 of the protective chip 300, 700 has the advantage that further processing of the contact areas 240, 340, 745, 740 arranged at the second surfaces 202, 602, 302, 702 is no longer necessary after the production of the molded body 400, 800. However, the covering of the second surface 202, 602 of the optoelectronic semiconductor chip 200, 600 and of the second surface 302, 702 of the protective chip 300, 700 is not absolutely necessary.

In a subsequent method step, the molded body 400, 800 is formed. During the formation of the molded body 400, 800, the optoelectronic semiconductor chip 200, 600 and the protective chip 300, 700 are embedded into the molded body 400, 800. The molded body 400, 800 is preferably produced by means of a molding process. After the formation of the molded body 400, 800, if necessary, the second surface 202, 602 of the optoelectronic semiconductor chip 200, 600 and the second surface 302, 702 of the protective chip 300, 700 are exposed by removal of a part of the molded body 400, 800.

In a subsequent further processing step, the electrically conductive connections 110, 120, 510, 520 are created.

In one preferred embodiment of the method described, a multiplicity of optoelectronic semiconductor components 100, 500 are produced in parallel. For this purpose, a multiplicity of optoelectronic semiconductor chips 200, 600 and a corresponding multiplicity of protective chips 300, 700 are simultaneously arranged on a common carrier and embedded into a common large molded body. It is only after further processing steps have been carried out, such as the creation of the electrically conductive connections 110, 120, 510, 520, that the many optoelectronic semiconductor components 100, 500 are separated from one another by division of the molded body.

The invention has been illustrated and described in greater detail on the basis of the preferred exemplary embodiments. Nevertheless, the invention is not restricted to the examples disclosed. Rather, other variations can be derived therefrom by the person skilled in the art, without departing from the scope of protection of the invention.

The invention claimed is:

1. An optoelectronic semiconductor component comprising:
    an optoelectronic semiconductor chip comprising a first surface and a second surface, wherein a first electrical contact and a second electrical contact are arranged at the first surface of the optoelectronic semiconductor chip;
    a protective chip comprising a protective diode and having a first surface and a second surface, wherein a third electrical contact and a fourth electrical contact are arranged at the first surface of the protective chip, the third electrical contact being electrically conductively connected to the first electrical contact and the fourth electrical contact being electrically conductively connected to the second electrical contact; and
    a molded body, wherein the optoelectronic semiconductor chip and the protective chip are embedded into the molded body,
    wherein the first surface of the optoelectronic semiconductor chip and the first surface of the protective chip are not covered by the molded body,
    wherein the second surface of the optoelectronic semiconductor chip and the second surface of the protective chip are not covered by the molded body,
    wherein the first surface of the optoelectronic semiconductor chip, the first surface of the protective chip and a top side of the molded body jointly form a top side of the optoelectronic semiconductor component,
    wherein the second surface of the optoelectronic semiconductor chip, the second surface of the protective chip and an underside of the molded body jointly form an underside of the optoelectronic semiconductor component, wherein a first electrical contact area and a second electrical contact area are arranged at the underside of the optoelectronic semiconductor component, wherein the optoelectronic semiconductor chip and the protective chip are electrically connected to the first electrical contact area and the second electrical contact area, and wherein the second electrical contact area is arranged at the second surface of the protective chip.

2. The optoelectronic semiconductor component as claimed in claim 1, wherein the optoelectronic semiconductor chip comprises a light emitting diode that is electrically connected antiparallel with the protective diode.

3. The optoelectronic semiconductor component as claimed in claim 1, wherein the optoelectronic semiconductor component is embodied as a surface-mountable component.

4. The optoelectronic semiconductor component as claimed in claim 1, wherein the protective chip has an electrically conductive connection between the second electrical contact area and the fourth electrical contact.

5. The optoelectronic semiconductor component as claimed in claim 1, wherein the first electrical contact area is arranged at the second surface of the protective chip.

6. The optoelectronic semiconductor component as claimed in claim 5, wherein the protective chip has an electrically conductive connection between the first electrical contact area and the third electrical contact.

7. The optoelectronic semiconductor component as claimed in claim 5, wherein a thermally conductive contact area is arranged at the second surface of the optoelectronic semiconductor chip.

8. The optoelectronic semiconductor component as claimed in claim 1, wherein the first electrical contact area is arranged at the second surface of the optoelectronic semiconductor chip.

9. The optoelectronic semiconductor component as claimed in claim 8, wherein the optoelectronic semiconductor chip has an electrically conductive connection between the first electrical contact area and the first electrical contact.

10. The optoelectronic semiconductor component as claimed in claim 1, wherein the first electrical contact and the third electrical contact are electrically connected through a bond connection.

11. The optoelectronic semiconductor component as claimed in claim 1, wherein the first electrical contact and the third electrical contact are electrically connected through a planar connection.

12. The optoelectronic semiconductor component as claimed in claim 1, wherein the first surface of the optoelectronic semiconductor chip is a radiation emission face of the optoelectronic semiconductor chip.

13. The optoelectronic semiconductor component as claimed in claim 1, wherein the optoelectronic semiconductor chip is a light emitting device (LED) chip.

14. An optoelectronic semiconductor component comprising:
- an optoelectronic semiconductor chip comprising a light emitting diode with an anode and a cathode;
- a protective chip comprising a protective diode with an anode and a cathode; and
- a molded body embedding the optoelectronic semiconductor chip and the protective chip such that a first surface of the optoelectronic semiconductor chip and a first surface of the protective chip are not covered by the molded body and a second surface of the optoelectronic semiconductor chip and a second surface of the protective chip are not covered by the molded body;
- a first electrical connection of the first surface of the optoelectronic semiconductor chip and the first surface of the protective chip, the first electrical connection electrically connecting the anode of the light emitting diode to the cathode of the protective diode; and
- a second electrical connection of the first surface of the optoelectronic semiconductor chip and the first surface of the protective chip, the second electrical connection electrically connecting the cathode of the light emitting diode to the anode of the protective diode,
- wherein the first surface of the optoelectronic semiconductor chip, the first surface of the protective chip and a top side of the molded body jointly form a top side of the optoelectronic semiconductor component,
- wherein the second surface of the optoelectronic semiconductor chip, the second surface of the protective chip and an underside of the molded body jointly form an underside of the optoelectronic semiconductor component,
- wherein a first electrical contact area and a second electrical contact area are arranged at the underside of the optoelectronic semiconductor component,
- wherein the optoelectronic semiconductor chip and the protective chip are electrically connected to the first electrical contact area and the second electrical contact area, and
- wherein the second electrical contact area is arranged at the second surface of the protective chip.

* * * * *